(12) United States Patent
White et al.

(10) Patent No.: US 6,820,298 B2
(45) Date of Patent: Nov. 23, 2004

(54) WAFER SCRUBBING DEVICE HAVING BRUSH ASSEMBLY AND MOUNTING ASSEMBLY FORMING SPHERICAL JOINT

(75) Inventors: John M White, Hayward, CA (US); Ying Yu, Cupertino, CA (US); Michael Sugarman, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 432 days.

(21) Appl. No.: 09/838,959

(22) Filed: Apr. 19, 2001

(65) Prior Publication Data

US 2002/0152567 A1 Oct. 24, 2002

(51) Int. Cl.$^7$ .................................................. B08B 1/04
(52) U.S. Cl. ............................. 15/77; 15/88.3; 15/21.1; 15/179; 403/322.1; 403/325
(58) Field of Search ........................... 15/77, 21.1, 179, 15/392, 88.3; 403/321, 322.1, 322.3, 322.4, 324, 325

(56) References Cited

U.S. PATENT DOCUMENTS

| | | | | |
|---|---|---|---|---|
| 1,613,396 A | * | 1/1927 | Keller, Sr. .................... | 15/392 |
| 3,879,786 A | | 4/1975 | Larkin ......................... | 15/88.3 |
| 3,971,097 A | * | 7/1976 | Clark ........................... | 15/179 |
| 4,914,777 A | * | 4/1990 | Cartellone .................... | 15/392 |
| 5,475,889 A | | 12/1995 | Thrasher et al. ............. | 15/88.3 |
| 6,082,377 A | | 7/2000 | Frey ............................... | 134/6 |
| 6,324,714 B1 | * | 12/2001 | Walz et al. .................... | 15/392 |

* cited by examiner

Primary Examiner—Theresa T. Snider
(74) Attorney, Agent, or Firm—Dugan & Dugan (57) ABSTRACT

A brush mounting system for a wafer scrubbing device includes a brush mandrel and a mounting assembly on which the brush mandrel is mounted. The mounting assembly includes a mounting member adapted to be mounted to a wall of the wafer scrubbing device, and a bearing secured to the mounting member. A brush support is rotatably mounted on the bearing and has an outer end that includes a contact surface adapted to contact the brush mandrel. The contact surface has a spherical profile. The brush mandrel includes a corresponding contact surface having a spherical profile, so that the brush mandrel and the mounting assembly form a spherical joint at the point of contact.

16 Claims, 7 Drawing Sheets

WAFER SCRUBBING DEVICE HAVING BRUSH ASSEMBLY AND MOUNTING ASSEMBLY FORMING SPHERICAL JOINT

FIELD OF THE INVENTION

The present invention is generally concerned with apparatuses for cleaning thin substrates such as semiconductor wafers, compact discs, flat panel displays and the like. More particularly, the invention is concerned with brush apparatuses for cleaning thin substrates.

BACKGROUND OF THE INVENTION

For fabrication of semiconductor devices, thin slices or wafers of semiconductor material require polishing by a process that applies an abrasive slurry to the wafer's surfaces. After polishing, slurry residue is generally cleaned or scrubbed from the wafer surfaces via mechanical scrubbing devices, such as brushes made from porous or sponge like material.

A brush apparatus for cleaning discs is described in co-pending U.S. patent application Ser. No. 09/580,879, filed May 30, 2000 and assigned to the present assignee, entitled "Brush Core for Disc Scrubbing Apparatus and Method for Use Thereof". The entirety of this prior application is incorporated herein by reference.

Figure 1:
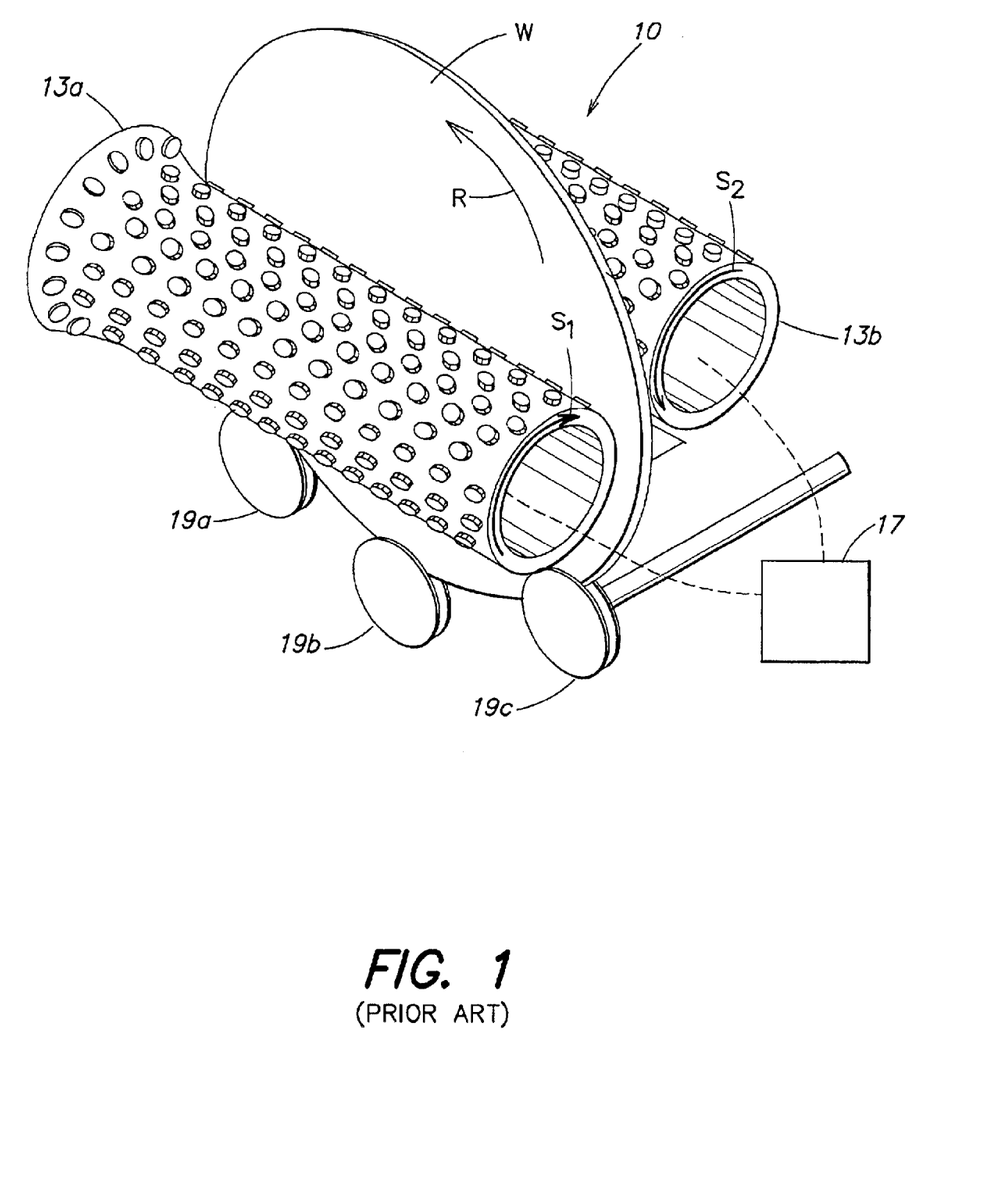
FIG. 1 is a schematic side perspective view of a wafer scrubber device to which the present invention may be applied.

FIG. 1 is a schematic side perspective view of a scrubbing device 10 for wafer cleaning of the type disclosed in the above-referenced prior patent application. The scrubbing device 10 includes first and second brush rollers, 13a and 13b, which are positioned to contact both sides of a wafer W. A known mechanism 17, such as a motor, is operatively coupled to the first and second brush rollers, 13a and 13b, so as to selectively rotate the first and second brush rollers, 13a and 13b. Also, the wafer W is supported on rotating wheels 19a–19c for both supporting and rotating the wafer W.

In operation the first and second brush rollers 13a and 13b are initially in an open position at a sufficient distance from each other so as to allow a wafer to be inserted therebetween. Thereafter, the wafer W to be cleaned is positioned on the rotating wheels 19a–c between the first and second brush rollers, 13a and 13b, and the brush rollers assume a closed position, sufficiently close to each other so as to both hold the wafer W in place therebetween and to exert a force on the wafer surface adequate to achieve effective cleaning.

Once the brush rollers are in the closed position, the motor 17 is engaged, and the first and second brush rollers, 13a and 13b, begin to spin. Preferably, the brush rollers spin in opposite directions, as indicated by arrows S1 and S2 in FIG. 1, applying forces to the wafer in a downward direction while the wafer rotates, so as to drive the wafer into the rotating wheel 19a–c so that the wafer remains engaged by the rotating wheels.

While the pair of brush rollers spin, the rotating wheels 19a–c which engage the wafer's edge rotate causing the wafer to rotate. Rotation of the wafer W helps to ensure that the pair of brush rollers thoroughly contact and clean the entire surface of the wafer W. In addition, a cleaning liquid such as de-ionized water is supplied to the wafer surface through perforations in the brush surface to assist in the removal of contaminants.

In FIG. 1, the brushes 13a and 13b have been schematically illustrated as positioned against the wafer W without supporting structure for mounting the brushes. However, as will be recognized by those who are skilled in the art, in a practical embodiment of a wafer scrubber, there must be provided suitable mechanisms for rotatably mounting the brushes in place, transmitting rotary motion to the brushes from a motor, and supplying cleaning liquid to the brushes. According to known techniques, each brush is mounted on a rigid core and a respective mounting assembly is provided to rotatably support each end of the rigid core. One of the mounting assemblies may be motor driven to impart motion to the rigid core and the mounted brush via the driven mounting assembly. The portion of the other mounting assembly which is connected to the rigid core has rotary motion transmitted thereto by the rigid core. It is known to supply cleaning liquid to the brush through the mounting assembly that is not motor driven.

Figure 2:
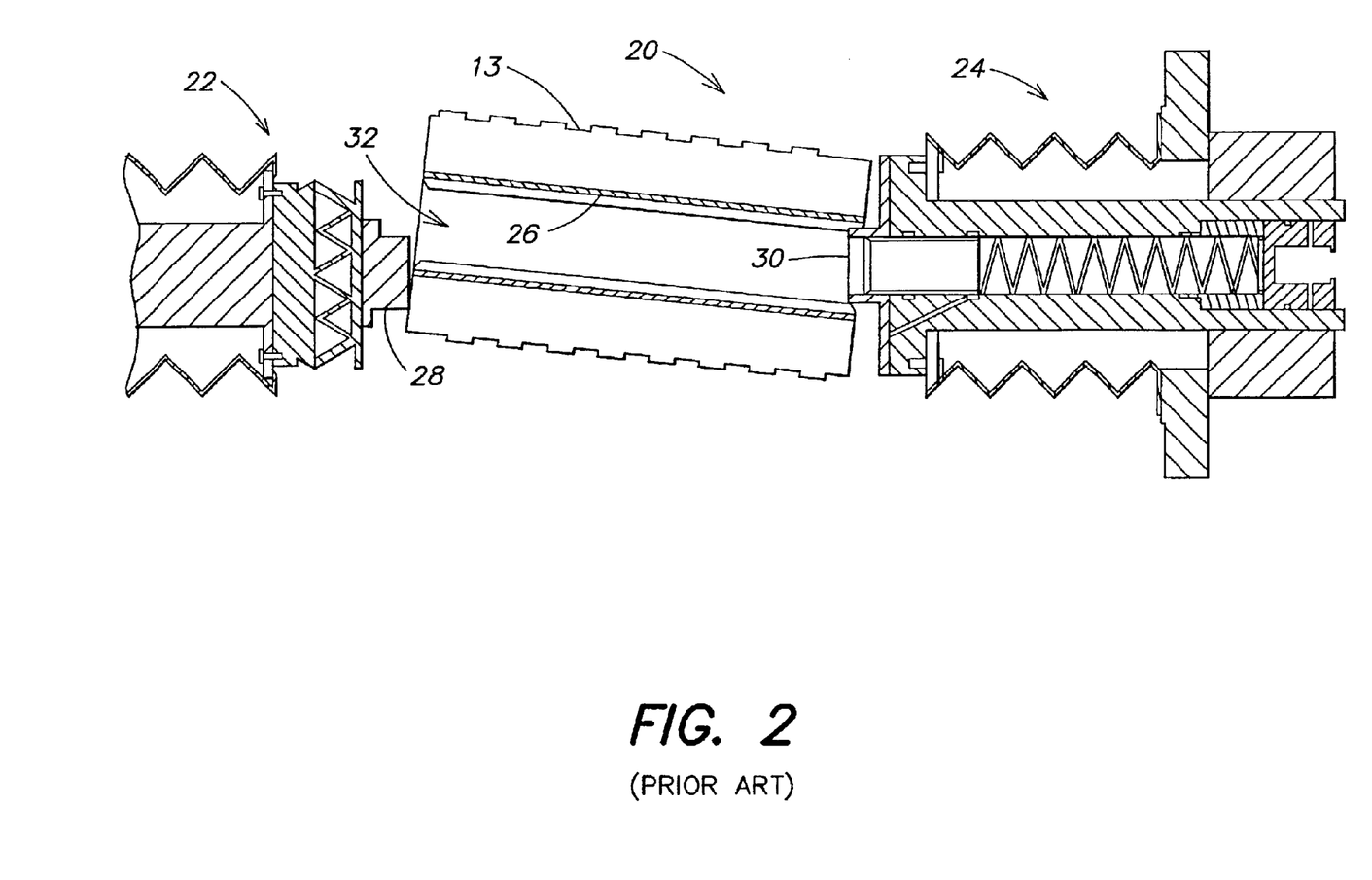
FIG. 2 is a side cross-sectional view of a conventional brush mounting system.

FIG. 2 is a side cross-sectional view showing a brush assembly 20 being installed between brush mounting assemblies 22 and 24. Brush assembly 20 includes a brush 13 mounted on a rigid core or mandrel 26. The brush mounting assemblies 22, 24 respectively have brush mounting supports or spindles 28, 30, to which the core 26 is mounted. The spindles 28, 30 each have a cylindrical profile which allows the spindles to be inserted into the interior 32 of the core 26.

Each of the brush mounting assemblies 22, 24 is mounted on a respective wall (not shown) of a chamber (not shown) of the wafer scrubbing device. It is intended that the brush mounting assemblies 22, 24 be positioned relative to each other such that the respective spindles, 28, 30 are coaxially aligned with each other. Bearings (not separately shown) are provided in the brush mounting assemblies to permit the portions of the assemblies touching the brush assembly to rotate with the brush assembly. As noted before, one of the brush mounting assemblies is motor driven to impart rotational motion to the brush assembly.

In practice, it is difficult to precisely align the brush mounting assemblies so that the respective spindles 28, 30 share a common axis. When the brush mounting assemblies are misaligned, mounting of the brush assembly thereon may cause the brush assembly to bend. In such a case, uneven loads may be placed on the bearings of the brush mounting assemblies, leading to excessive wear of the bearings and premature failure of the brush mounting assemblies. Furthermore, misalignment of the brush mounting assemblies and bending of the brush assembly may cause the brush 13 to be mis-positioned relative to the wafer and to contact the wafer's surface unevenly. That is, the brush 13 may contact the wafer surface with a greater than desired force, which may result in scratching the wafer surface, or the brush may contact the surface with less than desired force, which may result in insufficient cleaning.

It would accordingly be desirable to provide an improved brush mounting system that addresses the problem of mounting assembly misalignment.

SUMMARY OF THE INVENTION

In accordance with the invention, a mounting assembly for a wafer-scrubber brush includes a mounting member adapted to be mounted to a wall of the wafer scrubbing device, a bearing secured to the mounting member, and a brush support rotatably mounted on the bearing. The brush support has an outer end that includes a contact surface adapted to contact a brush mandrel. The contact surface has a spherical profile.

The contact surface may have a convex shape adapted to mate with a concave portion of the brush mandrel, or may have a concave shape adapted to mate with a convex portion of the brush mandrel. The mounting assembly may further include a spring enclosed in the brush support and adapted to bias the outer end of the brush support against the brush mandrel.

The outer end of the brush support may include an extension member that extends outwardly beyond the contact surface and is adapted to limit rotational motion of the outer end of the brush support relative to the brush mandrel.

According to another aspect of the invention, a mandrel adapted to mount a wafer scrubber brush includes a generally cylindrical body. The body has an end adapted to abut a mounting support, and the end includes a contact surface adapted to contact the mounting support. The contact surface has a spherical profile.

According to still another aspect of the invention, a wafer scrubbing device includes a mounting assembly and a brush assembly mounted to the mounting assembly. The mounting assembly and the brush assembly have respective joint portions that mate together to form a spherical joint.

Thus, according to the invention, respective contact portions of the brush mandrel and the brush mounting support have spherical profiles so that a spherical joint is formed between the brush mandrel and the brush mounting support. This arrangement may compensate for misalignment between the two mounting assemblies required to mount the brush and may allow the brush assembly to be mounted between misaligned mounting assemblies without bending the brush assembly. Consequently, uneven loading of the bearings of the brush mounting assemblies may be avoided and the useful life of the brush mounting assemblies may be extended. Furthermore, the brush, when mounted, may be reliably positioned for even contact with the wafer surface, thereby providing for thorough cleaning of the wafer without scratching the wafer.

Other objects, features and advantages of the present invention will become more fully apparent from the following detailed description of the preferred embodiments, the appended claims, and the accompanying drawings.

DETAILED DESCRIPTION OF THE PREFERRED EMBODIMENTS

Figure 3:
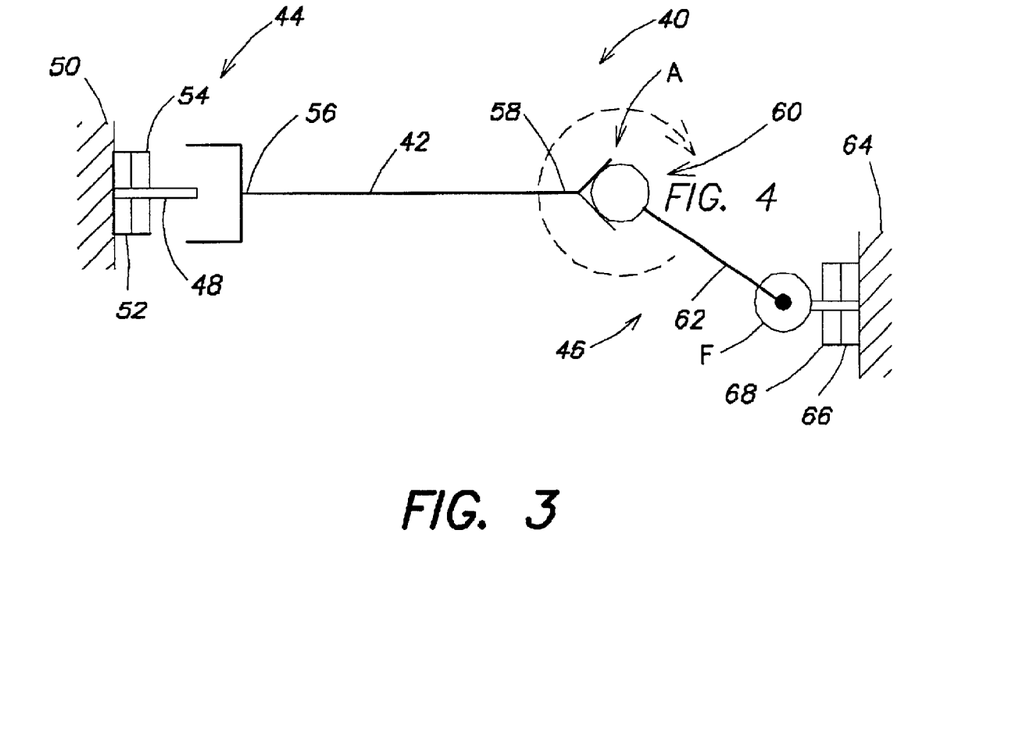
FIG. 3 is a schematic side view of a brush mounting system provided in accordance with the present invention.

FIG. 3 is a schematic illustration of a brush mounting system 40 provided in accordance with the invention. The system 40 includes a brush core or mandrel 42 on which a brush (not shown in FIG. 3) is mounted. The mandrel 42, in turn, is mounted between brush mounting assemblies 44 and 46.

The brush mounting assembly 44 may be a conventional, motor-driven brush mounting assembly having a cylindrical spindle 48. The conventional brush mounting assembly 44 is mounted to a wall 50 of a wafer scrubbing device via a mounting member such as mounting plate 52. A bearing 54 is secured to the mounting plate 52. The spindle 48 is rotatably mounted on the bearing 54.

The brush mandrel 42 has a first end 56 that has a conventional configuration for mounting to the conventional cylindrical spindle 48. The brush mandrel 42 also has a second end 58 that is shaped in accordance with the A invention to form a spherical joint 60 together with a brush mounting support 62 of the brush mounting assembly 46.

The inventive brush mounting assembly 46 is mounted to a wall 64 of the wafer scrubbing device opposite from the conventional brush mounting assembly 44. The inventive brush mounting assembly 46 is secured to the wall 64 via a mounting member such as mounting plate 66. The inventive mounting assembly 46 includes a bearing 68 that is secured to the mounting plate 66. The brush mounting support 62 is rotatably mounted to the bearing 68. Note that "F" schematically references a degree of freedom which may be provided in one aspect. Although this additional degree of freedom may be provided by a number of mechanisms, one such mechanism is a flexible coupling 88 shown and described with reference to FIG. 5.

As illustrated in somewhat exaggerated fashion in FIG. 3, the mounting assemblies 44, 46 are mounted so as not to be in axial alignment with each other. This is not an intended condition, but may occur due to human error or as a result of normal manufacturing imprecision.

Figure 4:
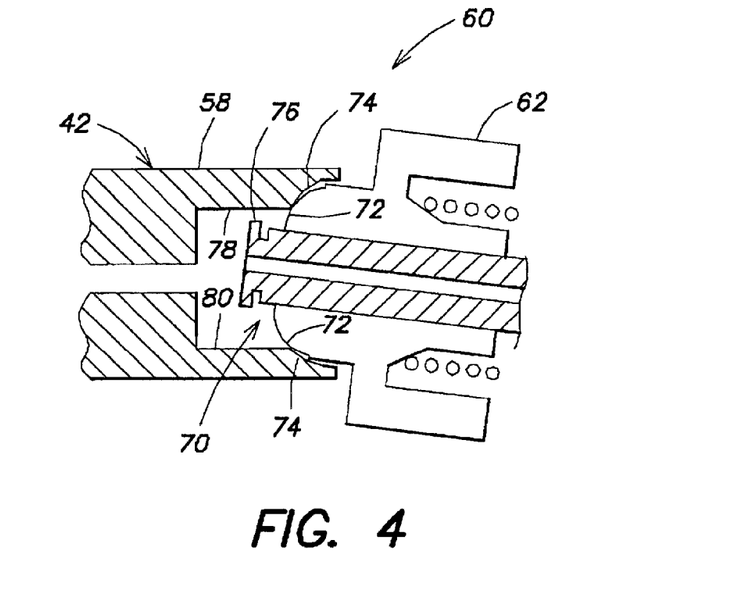
FIG. 4 is a side cross-sectional view showing details of a portion of the mounting system of FIG. 3.

FIG. 4 is a side cross-sectional view of a portion of the system 40 corresponding to the region A of FIG. 3. FIG. 4 shows details of the spherical joint 60. As seen from FIG. 4, brush mounting support 62 has an outer end 70 which has a contact surface 72 adapted to contact the brush, mandrel 42. The contact surface 72 has a spherical profile so as to form a part of the spherical joint 60 with the brush mandrel 42.

The end 58 of the brush mandrel 42 has a contact surface 74 adapted to be in contact with the contact surface 72 of the brush mounting support 62. The contact surface 74 of the brush mandrel 42 has a spherical profile and is dimensioned so as to mate with the contact surface 72 of the brush mounting support 62, thereby forming the spherical joint 60. It will be observed that, in the example shown in FIG. 4, the contact surface 72 of the brush mounting support 62 is convex, and the contact surface 74 of the brush a mandrel 42 is concave.

Continuing to refer to FIG. 4, the outer end 70 of the brush mounting support 62 has an extension 76 that extends outwardly beyond the contact surface 72. The extension 76 serves to limit the extent to which the brush mandrel 42 and the brush mounting support 62 can rotate relative to each other at the joint 60, by potentially coming into contact with internal walls 78, 80 of the brush mandrel 42.

Figure 5:
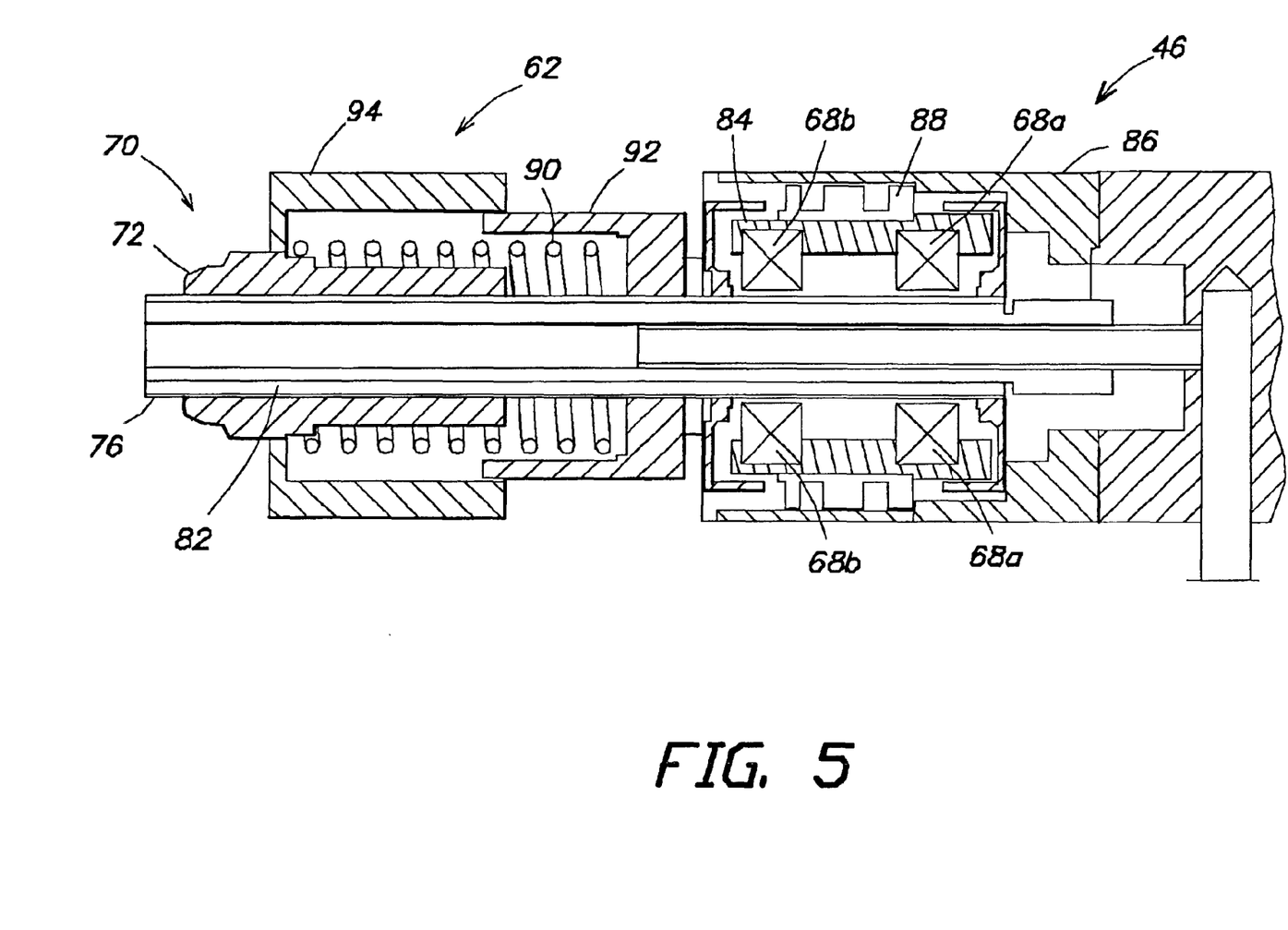
FIG. 5 is a side-cross sectional view of a brush mounting assembly that is part of the brush mounting system of FIG. 3.

FIG. 5 is a side cross-sectional view of an exemplary embodiment of the inventive brush mounting assembly 46, showing additional details of the inventive brush mounting assembly 46. As seen from FIG. 5, brush mounting support 62 is mounted on a hollow shaft 82. The hollow shaft 82 is mounted for rotation on bearings 68a and 68b. Bearings 68a, 68b are mounted in a housing 84. The housing, in turn, is secured to a block 86 by means of the flexible coupling 88. The flexible coupling 88 flexes to partially compensate for misalignment between the respective axes of the brush mounting assemblies 44, 46.

The block 86 is mounted to the wall of the wafer scrubbing device via a mounting plate, which is not shown in FIG. 5.

The brush mounting support 62 includes a spring 90 contained within a fixed casing half 92 and a movable casing half 94. The movable casing half 94 may be integrally formed with the spherical contact surface 72.

In operation, the brush mandrel 42 is inserted into a fresh brush to form a brush assembly. The brush assembly is mounted between the brush mounting assemblies 44 and 46 by mounting the brush mandrel 42 at its opposite ends to the brush mounting assemblies. Specifically, conventionally shaped end 56 of the brush mandrel 42 is mounted to the spindle 48 of the conventional motor-driven brush mounting assembly 44. At the same time, the end 58 of the brush mandrel 42 and particularly the contact surface 74 thereof, is brought into contact with the contact surface 72 of the outer end 70 of the brush mounting support 62 of brush mounting assembly 46. The contact between the respective contact surfaces 72 and 74 applies a force that compresses spring 90, moving the movable casing half 94 (FIG. 5) in a rightward direction.

Once the end 56 of the brush mandrel 42 is seated on the spindle 48 of the brush mounting assembly 44, the compression of the spring 90 is partially relieved, but the spring 90 continues to bias the outer end 70 of the brush mounting support 62 (and the contact surface 72) in the direction toward the brush mandrel 42. The biasing force provided by the spring 90 helps to hold the brush mandrel 42 between the mounting assemblies 44 and 46.

The axial orientation of the brush mandrel 42 is determined by the axis of the brush mounting assembly 44. The brush mandrel 42 may not be required to bend, since its end 58 is free to rotate relative to the axis of the brush mounting assembly 46 by operation of the spherical joint 60 formed by the respective contact surfaces 72, 74. The position of the end 58 of the brush mandrel 42 is determined by the axis of the brush mounting assembly 44. The spring 90 of the brush support 62 accommodates the outer end 70 of the inventive brush support 62 to the position of the end 58 of the brush mandrel 42. Flexible coupling 88 flexes to allow the brush support 62 to form an angle relative to the wall 64 (FIG. 3).

The same procedure may be followed with respect to both brush assemblies of a double sided scrubber. At that point, a wafer is placed in the scrubbing device, and the two brushes of the scrubbing device are moved into the closed position shown in FIG. 1. The brushes are rotated, and a cleaning liquid is supplied to the wafer (e.g., through perforations in the brush assembly).

With the brush mounting system of the present invention, even when the two brush mounting assemblies 44, 46 are out of alignment, the brush assembly may be mounted therebetween without bending the brush assembly, because of the spherical joint formed between one end of the brush assembly and the outer end of the corresponding inventive brush mounting assembly. Since the brush assembly is either not bent or is less bent than if only conventional brush mounting assemblies were employed, more even loads are applied to the bearings of the mounting assemblies. Consequently, the bearings last longer and the useful life of the mounting assemblies is extended. Furthermore, because the brush assembly may be less bent (if bent at all), the brush may be placed in more even contact with the wafer, so that wafer scratching or inadequate scrubbing by the brush may be reduced.

Figure 6:
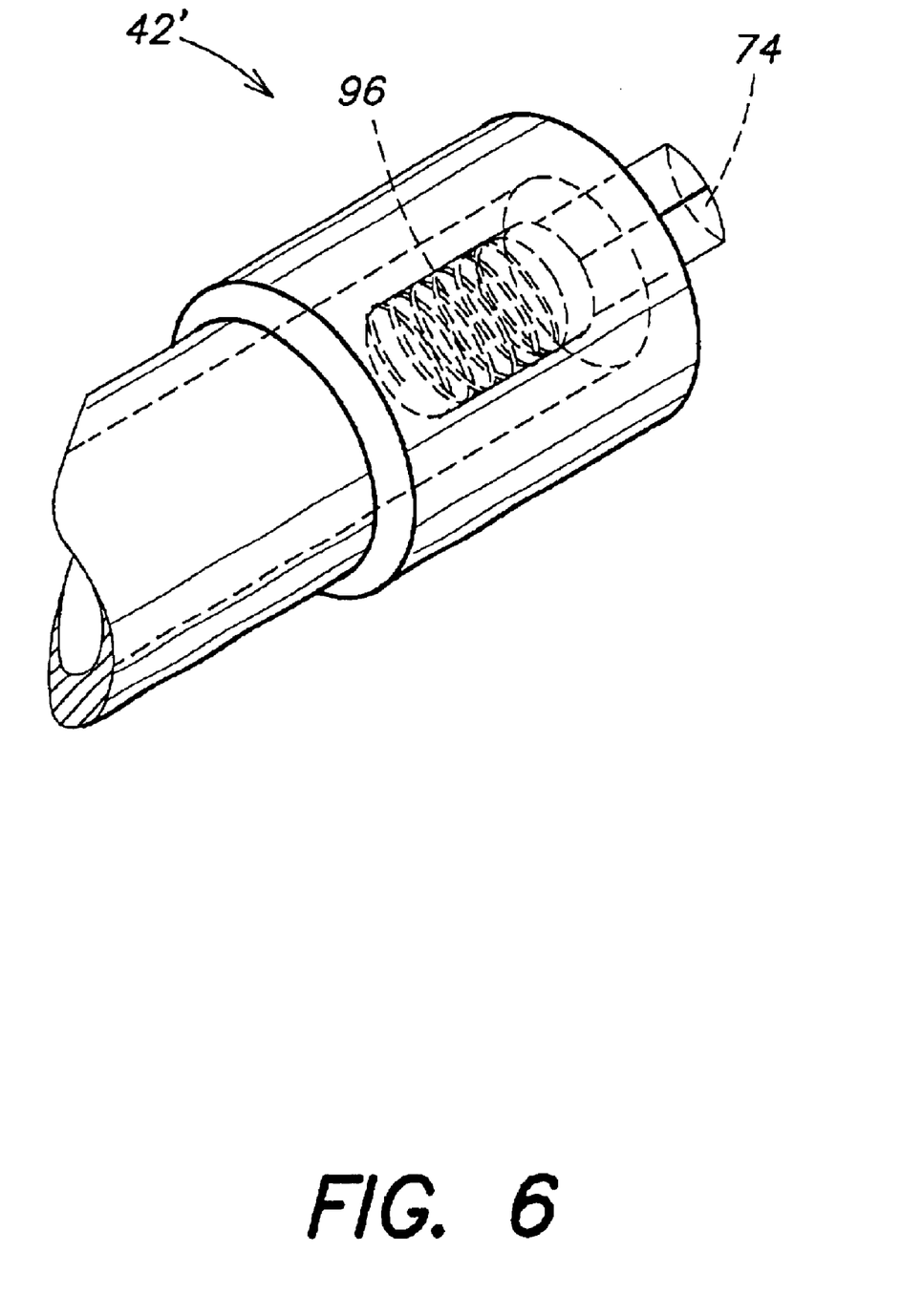
FIG. 6 is a side perspective view showing certain details of a brush mandrel provided according to another embodiment of the invention.

The foregoing description discloses only a preferred embodiment of the invention; modifications of the above disclosed apparatus which fall within the scope of the invention will be readily apparent to those of ordinary skill in the art. For instance, it is contemplated to provide a spring-loaded mandrel, instead of spring-loading the inventive brush mounting assembly 46. FIG. 6 is a side perspective view of a mandrel 42' that is spring-loaded in accordance with this alternative aspect of the invention. As seen from FIG. 6, the mandrel 42' holds a spring 96, which is provided to outwardly bias the contact surface 74 of the mandrel 42'.

Figure 7:
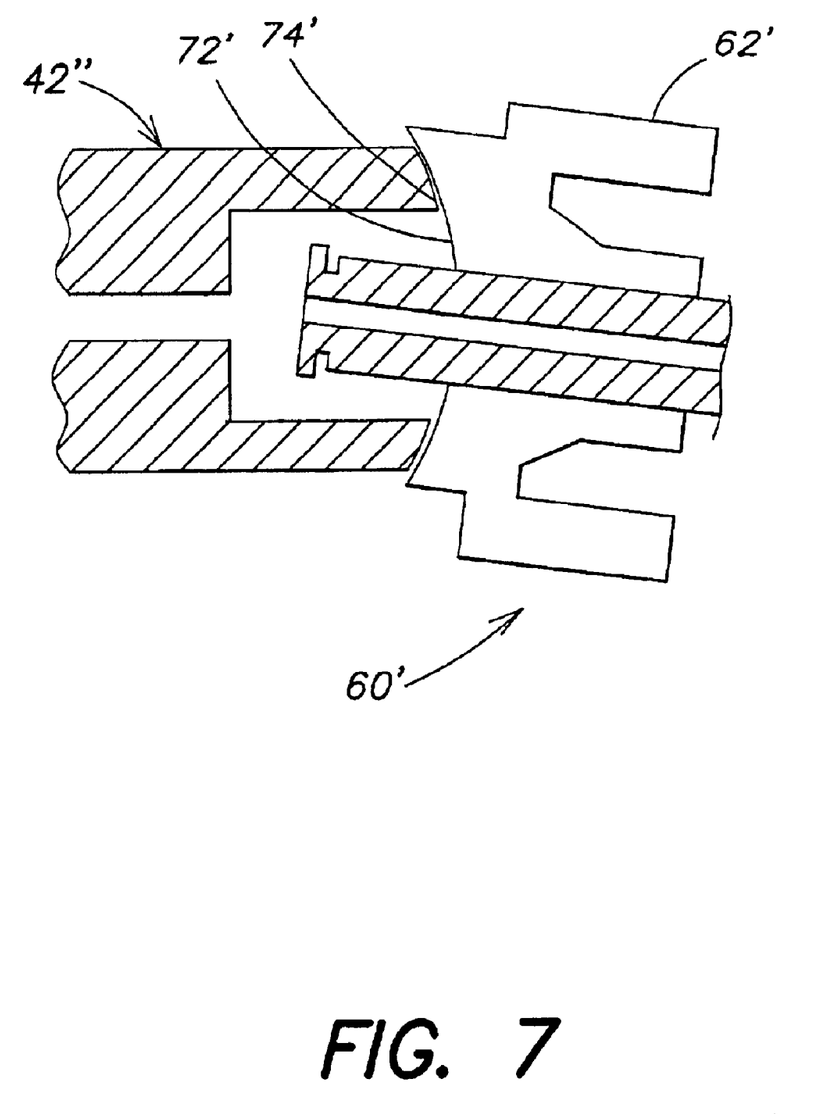
FIG. 7 is a side cross-sectional view, similar to FIG. 4, showing a joint formed by a brush mandrel and a brush support according to another embodiment of the invention.

Furthermore, instead of forming the spherical joint from a convex spherical contact surface on the inventive brush support 62 (FIG. 5) and a concave contact surface on the mandrel 42, the contact surfaces on the brush support may be made concave and the contact surface on the mandrel may be made convex. Such an arrangement is shown in FIG. 7, in which the modified mandrel 42'' has a convex spherical contact surface 74' and the modified brush support 62' has a concave spherical contact surface 72'. It will be appreciated that the contact surfaces 72', 74' together form a spherical joint 60'.

In the exemplary embodiment described above, the brush mounting assembly that was not motor driven was equipped with a contact surface having a spherical profile to form a spherical joint with the brush mandrel. As an alternative, it is contemplated to equip only the motor-driven brush mounting assembly with the contact surface that is spherically shaped to form a spherical joint with the brush mandrel, or to equip both the brush mounting assemblies (either or both of which may be motor driven) with the contact surface that is spherically shaped to form a spherical joint with the brush mandrel (as shown schematically in FIG. 8).

Figure 8:
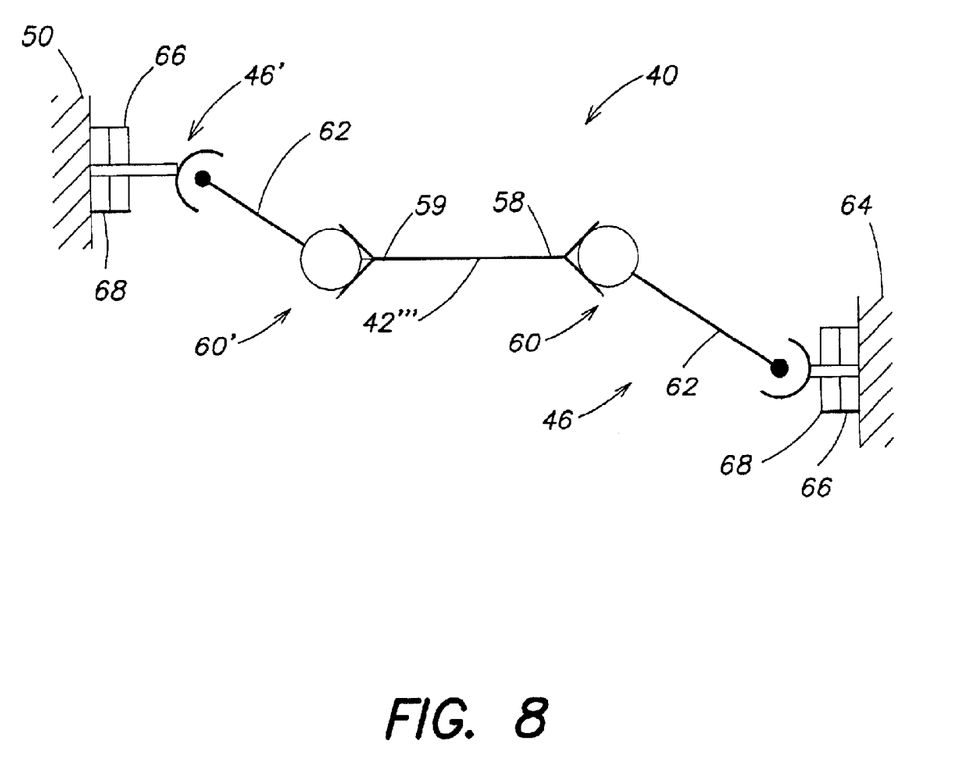
FIG. 8 is a schematic side view of a wafer scrubber device according to another embodiment of the invention.

As seen from FIG. 8, in this embodiment a brush mandrel 42''' is mounted between brush mounting assemblies 46, 46' and forms spherical joints 60, 60' therewith, respectively. That is, brush mandrel includes contact surfaces (not separately shown in FIG. 8) having spherical profiles at each end 58, 59, and the brush mounting assembly 46', like brush mounting assembly 46, has a corresponding contact surface (not separately shown) having a spherical profile. Thus respective joint portions of brush mandrel 42''' and brush mounting support 62 of brush mounting assembly 46' form the spherical joint 60'.

The contact surfaces of brush mandrel 42''' may both be concave, as indicated in FIG. 8, or one or both of the contact surfaces of brush mandrel 42''' may be convex. If a contact surface of brush 42''' is convex, then of course the contact surface of the corresponding brush mounting assembly 46 or 461 is made concave.

Moreover, previously illustrated embodiments have shown either the non-motor-driven brush mounting assembly or the brush mandrel as being spring-loaded. However, as another alternative, the motor-driven brush mounting assembly may be spring-loaded.

The member by which the mounting assembly is mounted to the wall of the wafer scrubbing device has been described as a "mounting plate". However, it is contemplated that a member of any convenient shape, and not necessarily a plate-shaped member, may be used to mount the brush mounting assembly to the wall of the wafer scrubbing device. Similarly, although two bearings are shown within the exemplary brush mounting assemblies, it will be understood that one or more bearings may be employed.

The brush core or mandrel 42 need not be a single integrated piece. For example, the mandrel 42 may be formed of two components, including an inner core and an outer core, as taught in above-referenced U.S. patent application Ser. No. 09/580,879. Finally, the invention may be employed within a single sided or double sided scrubber regardless of the orientation thereof (e.g., for scrubbing horizontal or vertically oriented wafers).

Accordingly, while the present invention has been disclosed in connection with the preferred embodiments thereof, it should be understood that other embodiments may fall within the spirit and scope of the invention, as defined by the following claims.

What is claimed is:

1. A mounting assembly for a wafer-scrubber brush, comprising:
   a bearing;
   a brush support rotatably mounted on the bearing and having an outer end adapted to couple to a brush mandrel; and
   a flexible coupling adapted to flexibly mount the bearing to a mounting member.

2. The mounting assembly of claim 1, wherein the outer end of the brush support includes a contact surface adapted to contact the brush mandrel, the contact surface having a spherical profile.

3. The mounting assembly of claim 1, further comprising:
   a housing in which the bearing is mounted; and
   a second bearing mounted in the housing;
   the housing being mounted on the flexible coupling.

4. The mounting assembly of claim 1, wherein the outer end of the brush support includes a contact surface that compensates for a difference in an axial alignment of the mounting member and a second mounting member used in supporting the brush mandrel.

5. The mounting assembly of claim 1, wherein the outer end of the brush support includes a contact surface that compensates for a difference in an axial alignment of the mounting member and the brush mandrel.

6. The mounting assembly of claim 1, further comprising the mounting member, wherein the mounting member is adapted to be pivotably mounted to a wall of a wafer scrubbing device.

7. The mounting assembly of claim 1, wherein the outer end of the brush support includes a contact surface that has a convex shape adapted to mate with a concave portion of the brush mandrel.

8. The mounting assembly of claim 1, wherein the outer end of the brush support includes a contact surface that has a concave shape adapted to mate with a convex portion of the brush mandrel.

9. The mounting assembly of claim 1, further comprising a spring enclosed in the brush support and adapted to bias the outer end of the brush support against the brush mandrel.

10. A mounting assembly for a wafer-scrubber brush, comprising:
    a mounting member adapted to be mounted to a wall of a wafer scrubbing device;
    a bearing secured to the mounting member; and
    a brush support rotatably mounted on the bearing and having an outer end that includes a contact surface adapted to contact a brush mandrel, the contact surface having a spherical profile;
    wherein the outer end of the brush support includes an extension member that extends outwardly beyond the contact surface and is adapted to limit rotational motion of the outer end of the brush support relative to the brush mandrel.

11. The mounting assembly of claim 10, wherein the contact surface compensates for a difference in an axial alignment of the mounting member and a second mounting member used in supporting the brush mandrel.

12. The mounting assembly of claim 10 wherein the contact surface compensates for a difference in an axial alignment of the mounting member and the brush mandrel.

13. The mounting assembly of claim 10, wherein the mounting member is adapted to be pivotably mounted to the wall of a wafer scrubbing device.

14. The mounting assembly of claim 10, wherein the contact surface has a convex shape adapted to mate with a concave portion of the brush mandrel.

15. The mounting assembly of claim 10, wherein the contact surface has a concave shape adapted to mate with a convex portion of the brush mandrel.

16. The mounting assembly of claim 10, further comprising a spring enclosed in the brush support and adapted to bias the outer end of the brush support against the brush mandrel.

* * * * *